United States Patent
Deshmukh et al.

(10) Patent No.: US 7,307,452 B2
(45) Date of Patent: Dec. 11, 2007

(54) INTERCONNECT STRUCTURE ENABLING INDIRECT ROUTING IN PROGRAMMABLE LOGIC

(75) Inventors: Nitin Deshmukh, Delhi (IN); Kailash Digari, Greater Noida (IN)

(73) Assignee: STMicroelectronics Pvt. Ltd., Noida (IN)

( * ) Notice: Subject to any disclaimer, the term of this patent is extended or adjusted under 35 U.S.C. 154(b) by 25 days.

(21) Appl. No.: 11/258,616

(22) Filed: Oct. 25, 2005

(65) Prior Publication Data
US 2006/0139055 A1    Jun. 29, 2006

(30) Foreign Application Priority Data
Oct. 27, 2004    (IN)    .................. 2111/DEL/2004

(51) Int. Cl.
*H01L 25/00* (2006.01)
*H03K 19/177* (2006.01)

(52) U.S. Cl. .............................. 326/41; 326/37; 326/47

(58) Field of Classification Search ............ 326/37–41, 326/47
See application file for complete search history.

(56) References Cited

U.S. PATENT DOCUMENTS

| 6,934,927 B2* | 8/2005 | Kaptanoglu .................. 716/16 |
| 2003/0080776 A1* | 5/2003 | Kohno et al. .................. 326/39 |

* cited by examiner

*Primary Examiner*—Anh Q. Tran
(74) *Attorney, Agent, or Firm*—Gardere Wynne Sewell LLP

(57) ABSTRACT

An interconnect structure enables indirect routing in programmable logic. The structure includes a plurality of routing lines, and switch box(es) and connection boxes coupled to the plurality of routing lines. The connection boxes include at least one programmable switch in each routing track. The position of the programmable switch(es) in each connection box connected to same interconnect matrix differs from the position of said programmable switch(es) in corresponding routing tracks of other connection boxes thereby utilizing the connectivity of said switch box for input connections and increasing the flexibility of connections.

28 Claims, 13 Drawing Sheets

Figure 5 Simple Disjoint Switch Box
*(Prior Art)*

INTERCONNECT STRUCTURE ENABLING INDIRECT ROUTING IN PROGRAMMABLE LOGIC

PRIORITY CLAIM

The present application claims priority from Indian Patent Application No. 2111/Del/2004 filed Oct. 27, 2004, as a provisional application, and filed Oct. 21, 2005, as a complete application, the disclosures of which are hereby incorporated by reference.

BACKGROUND OF THE INVENTION

1. Technical Field of the Invention

The present invention relates to an interconnect structure enabling indirect routing in programmable logic.

2. Description of Related Art

When integrated circuits (ICs) were first introduced, they were extremely expensive and were limited in their functionality. Rapid strides in semiconductor technology have vastly reduced the cost while simultaneously increasing the performance of IC chips. However, the design, layout, and fabrication process for a dedicated, custom built IC remains quite costly. This is especially true for those instances where only a small quantity of a custom designed IC is to be manufactured. Moreover, the turn-around time (i.e., the time from initial design to a finished product) can frequently be quite lengthy, especially for complex circuit designs. For electronic and computer products, it is critical to be the first to market. Furthermore, for custom ICs, it is rather difficult to effect changes to the initial design. It takes time, effort, and money to make any necessary changes.

In view of the shortcomings associated with custom IC's, Field Programmable Gate Arrays (FPGA) offer an attractive solution in many instances. Basically, FPGAs are standard, high-density, off-the-shelf ICs, which can be programmed by the user to a desired configuration. Circuit designers first define the desired logic functions, and the FPGA is programmed to process the input signals accordingly. Thereby, FPGA implementations can be designed, verified, and revised in a quick and efficient manner. Depending on the logic density requirements and production volumes, FPGAs are superior alternatives in terms of cost and time-to-market.

A typical FPGA essentially consists of an outer ring of I/O blocks surrounding an interior matrix of configurable logic blocks. The I/O blocks residing on the periphery of an FPGA are user programmable, such that each block can be programmed independently to be an input or an output and can also be tri-statable. Each logic block typically contains programmable combinatorial logic and storage registers. The combinatorial logic is used to perform Boolean functions on its input variables. Often, the registers are loaded directly from a logic block input, or they can be loaded from the combinatorial logic.

Interconnect resources occupy the channels between the rows and columns of the matrix of logic blocks and also between the logic blocks and the I/O blocks. These interconnect resources provide the flexibility to control the interconnection between two designated points on the chip. Usually, a metal network of lines runs horizontally and vertically in the rows and columns between the logic blocks. Programmable switches connect the inputs and outputs of the logic blocks and I/O blocks to these metal lines (called input & output connection boxes). Crosspoint switches and interchanges at the intersections of rows and columns are used to switch signals from one line to another (called switch boxes). Often, long lines are used to run the entire length and/or breadth of the chip.

The functions of the I/O blocks, logic blocks, and their respective interconnections are all programmable. Typically, a configuration program stored in an on-chip memory controls these functions. The configuration program is loaded automatically from an external memory upon power-up, on command, or programmed by a microprocessor as part of system initialization.

A typical FPGA architecture is shown in the FIG. 1. The configurable logic block shown in the figure has its inputs connected to the routing fabric via the connection boxes (C-Box). The switch box (S-Box) can be of different topologies namely Wilton, Disjoint or Hyper Universal, which provide enhanced routability at the expense of some extra resources.

In recent trends, the connection boxes of a logic cluster are no longer concentrated on the four adjacent channels but on all four sides of a particular switch box making connection box and switch box appear as one single entity as shown in FIG. 2.

A typical configurable logic block (CLB) would be as shown in FIG. 3. The logic block shown has a full matrix on the input side of its connectivity with the routing fabric, and internal feedback matrix for merged nets. It could also possibly have a full matrix on the output side to connect to the routing fabric. For generic FPGA structures, the papers by Vaughn Betz, "Architecture and CAD for Speed and Area Optimization of FPGAs," Phd thesis, University of Toronto, 1998 and J. Rose, R. J. Francis, D. Lewis, and P. Chow, "Architecture of Field-Programmable Gate Arrays: The Effect of Logic Block Functionality on Area of Efficiency," IEEE Journal of Solid-State Circuits, Vol. 25 No. 5, Oct. 1990, pp. 1217-1225 can be referred.

In resent trends the designers have deviated from using full crossbars as they require large buffers and instead use depopulated matrices as in FIG. 4. The inputs of a look-up table (LUT) are identical and swappable by changing the configuration bits to implement the same logic. Utilizing this fact, and also that duplication in LUT inputs is unnecessary; a smaller input matrix as shown in FIG. 4 can replace the full matrix. The feedback matrix has been omitted for simplicity. Here the first 4×4 matrix serves the first inputs of all the four LUTs and the second matrix serves the second inputs and so on. Thus we see that the inputs of the logic block have been split into four domains; i.e., the inputs which drive the first inputs belong to one domain; those which drive the second inputs belong to the second domain and so on.

The disjoint switch box is very popular because of its ease during layout. A disjoint switch box is shown in FIG. 5. A disjoint switch box has similar one to one connections on all the sides. A signal on a particular track remains on the same track throughout the fabric. So if the logic block (CLB) in FIG. 6 is connected to a routing fabric with such a switch box via identical connection boxes on all the sides, an implied segregation of routing resources into domains is achieved as those tracks which connect to pins of a particular domain belong to that domain assuming that they do connect to one pin in one connection box. As shown in the figure, a total of sixteen input pins of a logic cluster form four different domains. The tracks connecting to these pins are accordingly demarcated. Further in case the routing domains are not segregated into domains, a routing line on one side gets connected to its corresponding routing line on the other side as shown in FIG. 7.

These configurations have greatly reduced routability. If a signal is routed on input line 705 to the Logic Block on a particular domain, then only limited tracks would be available via which the signal can be routed. In case domains are not available, the signal would be routed to its corresponding lines on the other sides. Specifically, only the routing tracks of same domain would be available as shown in FIGS. 6 and 7. A set of four segments from each side that form a part of the disjoint switch box, e.g., 701, 702, 703, 704, belong to the same domain. This arises from the fact that all four-connection boxes of a logic cluster are the same. Thus, there is a constraint on the connectivity of the routing tracks to other routing tracks.

Furthermore, if a net has sinks in more than one domain it has to duplicate the net onto routing fabric from the source itself. This increases the demand on routing tracks.

There is accordingly a need to solve the problems of underutilized domains, reduced routability, and unnecessary usage of routing tracks for multi domain fanout nets. Embodiments of the present invention address the problems of the prior art by use of a new input matrix, a systematic way of switch arrangements in the connection box and a new concept of reflection within the switch box. The connectivity in the input matrix has been changed to distribute load over the routing fabric uniformly when the logic block operates in special modes.

SUMMARY OF THE INVENTION

Embodiments of the present invention provide an interconnect structure that enables indirect routing in programmable logic, and provide a highly routable structure that avoids unnecessary usage of routing tracks for multi domain fan-out nets.

In accordance with an aspect of the invention, an interconnect structure enabling indirect routing in programmable logic comprises a plurality of routing lines and switch box(s) and connection boxes coupled to said plurality of routing lines. The connection boxes include at least one programmable switch in each routing track. The position of said programmable switch(es) in each connection box connected to same interconnect matrix differs from the position of said programmable switch(es) in corresponding routing tracks of other connection boxes thereby utilizing the connectivity of said switch box for input connections and increasing the flexibility of connections.

In accordance with another aspect of the invention, an interconnect structure enabling indirect routing in programmable logic comprises a plurality of routing lines and switch box(es) and connection boxes coupled to said plurality of routing lines. The connection boxes include a programmable switch in each routing track. The position of said programmable switch in each connection box connected to same interconnect matrix differs from the position of said programmable switch in corresponding routing tracks of other connection boxes thereby utilizing the connectivity of said switch box for input connections and increasing the flexibility of connections.

In accordance with yet another aspect of the invention, an interconnect structure enabling indirect routing in programmable logic comprises a plurality of routing lines and switch box(es) and connection boxes coupled to said plurality of routing lines. The connection boxes include a plurality of programmable switches in each routing track. The position of said programmable switches in each connection box connected to same interconnect matrix differs from the position of said programmable switches in corresponding routing tracks of other connection boxes thereby utilizing the connectivity of said switch box for input connections and increasing the flexibility of connections.

The interconnect structure is divided into at least one domain, each domain comprising predetermined number of routing lines having at least one said programmable switch thereby connecting a line of one domain to any line of other domains. Said routing lines include bidirectional and/or unidirectional lines.

Said switch box includes one of disjoint switch boxes, universal switch boxes, Wilton switch boxes and hyper universal switch boxes.

An incoming routing track of the connection boxes on three sides of said interconnect structure is connected to a common outgoing routing track coupled to the input matrix.

The incoming routing tracks of same or different domains linked to the connection boxes on three sides of said interconnect structure are connected to a common outgoing routing track coupled to a domain different from at least one said incoming routing track domains.

In accordance with another aspect of the invention, a method for enabling indirect routing comprises routing the input logic to the plurality of routing lines, and providing connection means to connect said routing lines as well as said input logic to said routing lines. A plurality of programmable switches are provided in each routing track. Said programmable switches are positioned in each connection box differently from the position of said programmable switches in corresponding routing tracks of other connection boxes thereby utilizing the connectivity of said switch box for input connections and increasing the flexibility of connections.

In general the invention proposes to increase the routability of the routing fabric by an ingenious way of distributing the switches in a connection box such that the switch box acts as a $F_s$:1 mux layer prior to the connection box in an indirect routing fashion. Where $F_s$ is the number of tracks driving a particular track in a switch box.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Aspects of the present invention deals with indirect routing of the input to the desired routing line/track. When all the tracks are logically equivalent, the input is routed to the desired routing line/track via one indirection. In case of domain based structure, every track drives one domain directly and the other domains via one indirection. This is termed as "reflection" or "indirect" routing. The routing lines can be bidirectional or unidirectional as explained in different embodiments. In unidirectional lines, an incoming track drives an outgoing track that drives the input; i.e., a track uses other tracks of other domains to drive the other domains.

Figure 1:
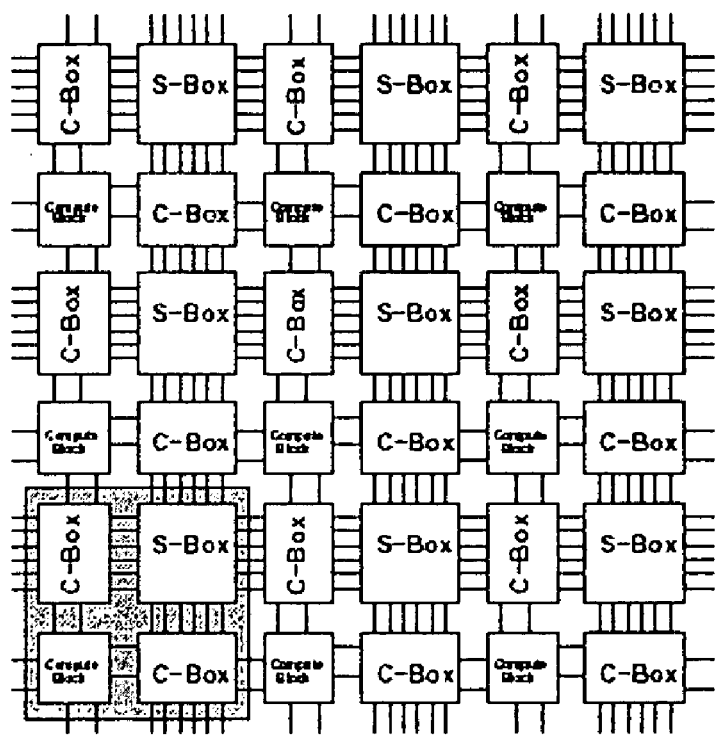
FIG. 1 shows a generic cluster of 4 four-input LUTs with input and feedback matrices.
Figure 2:
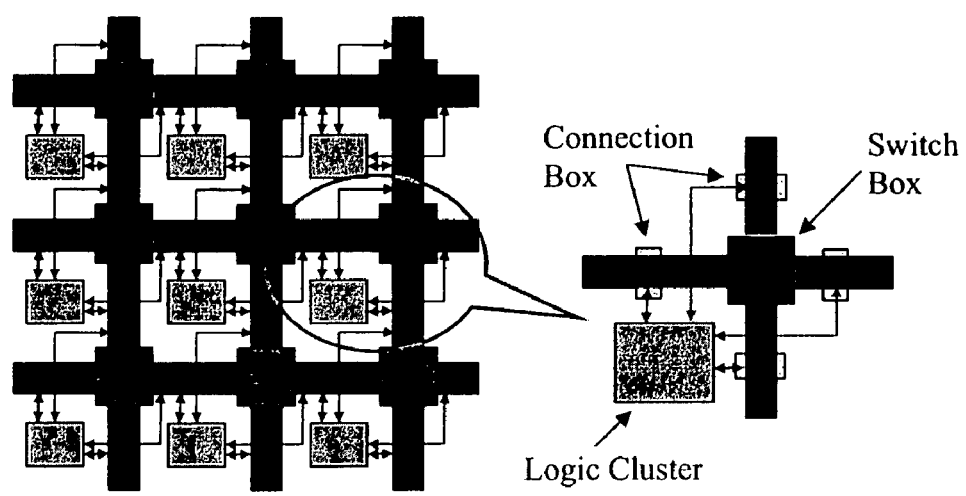
FIG. 2 shows current symmetrical FPGA architectures.
Figure 3:
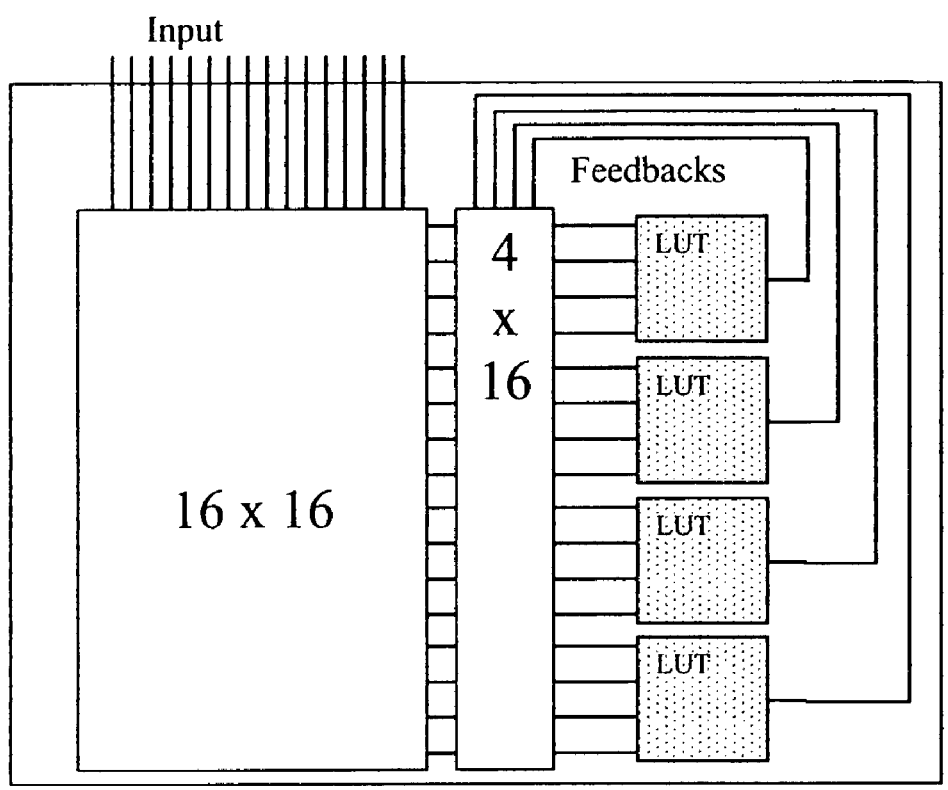
FIG. 3 shows a generic cluster of 4 four-input LUTs with input and feedback matrices.
Figure 4:
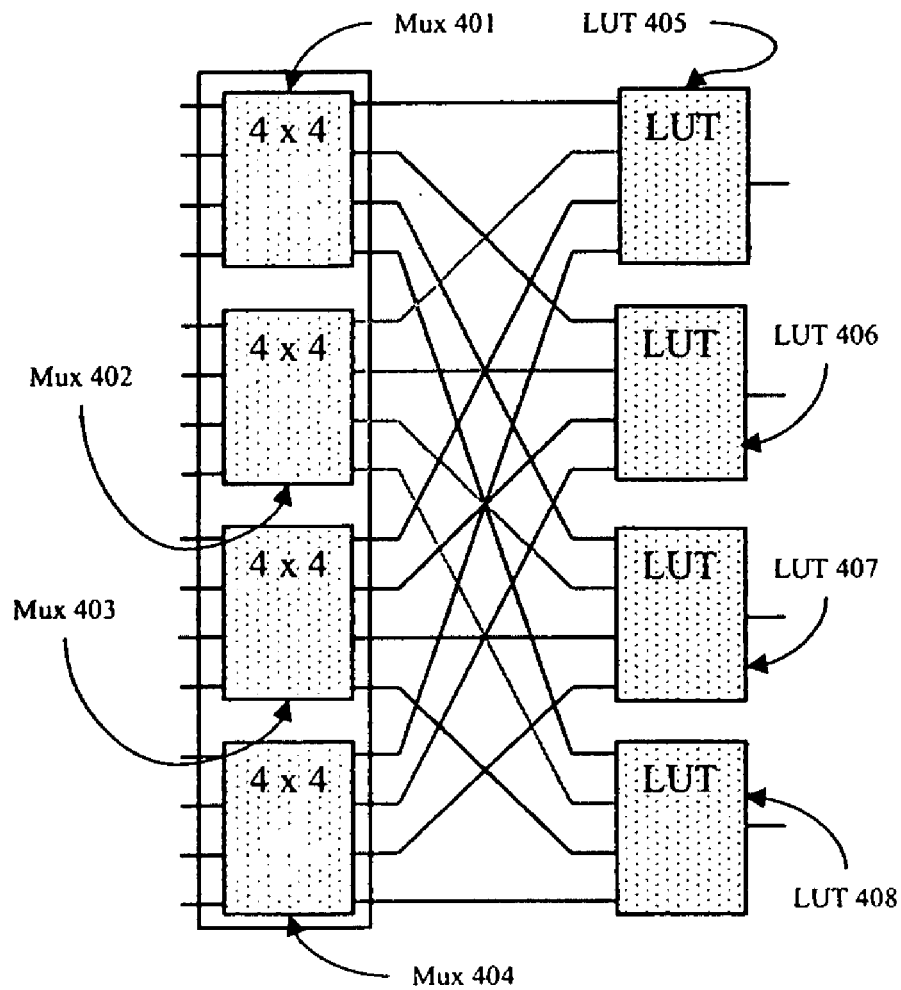
FIG. 4 shows a depopulated input matrix.
Figure 5:
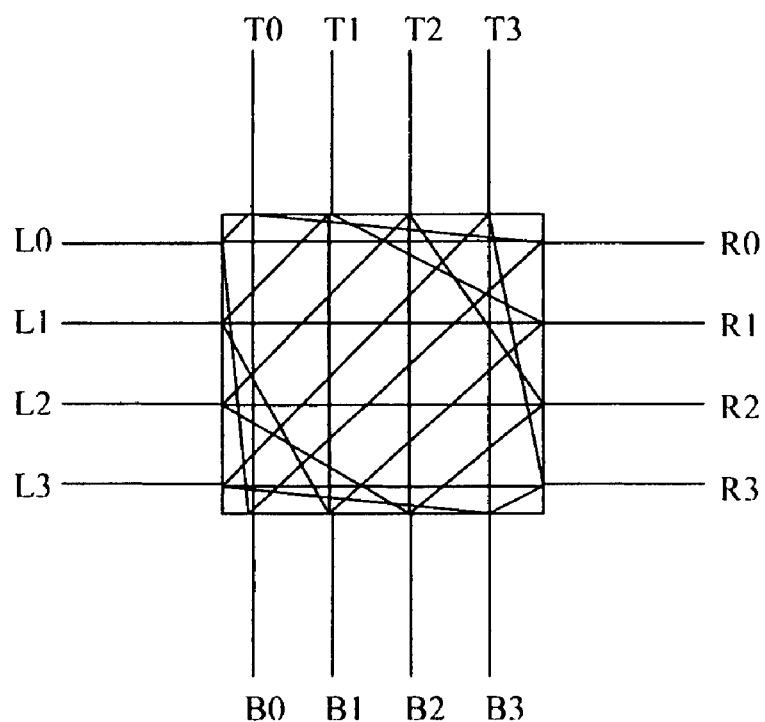
FIG. 5 shows a simple disjoint switch box.
Figure 6:
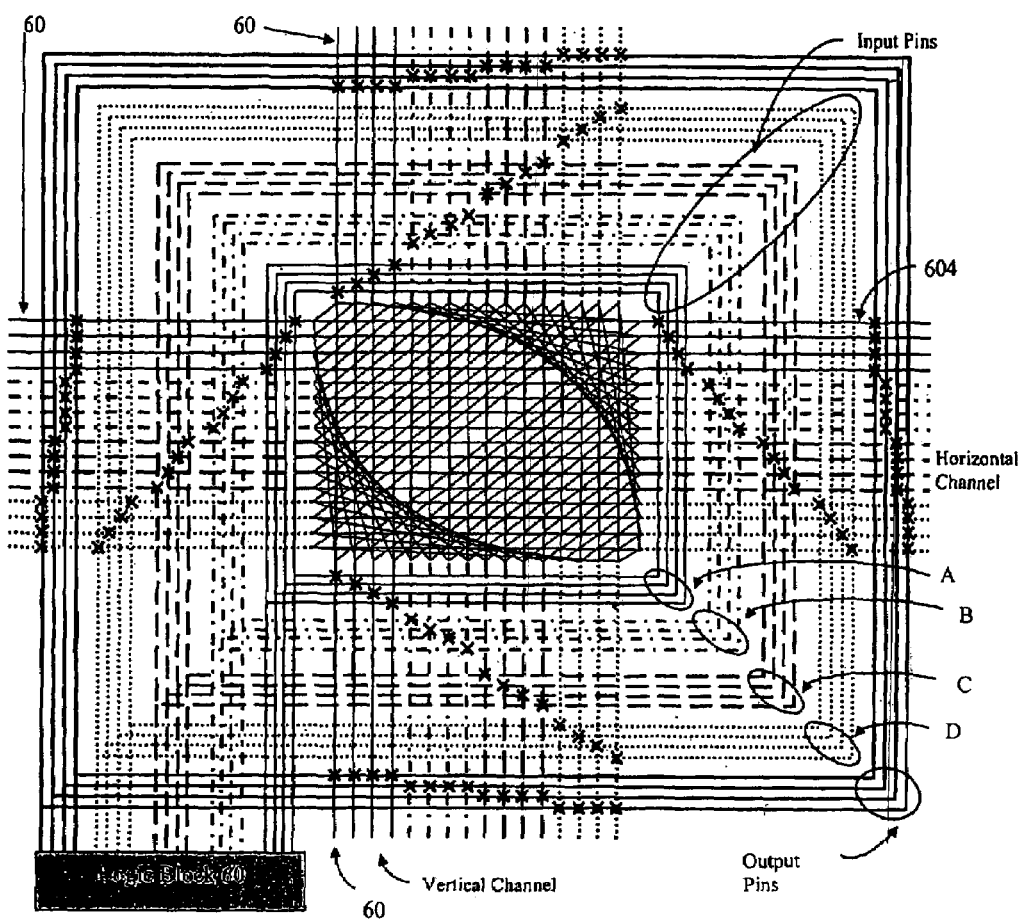
FIG. 6 shows a switch box and four connection boxes of logic block connected to a bi directional single length track routing fabric in a domain based structure, wherein the four connection boxes are identical.
Figure 7:
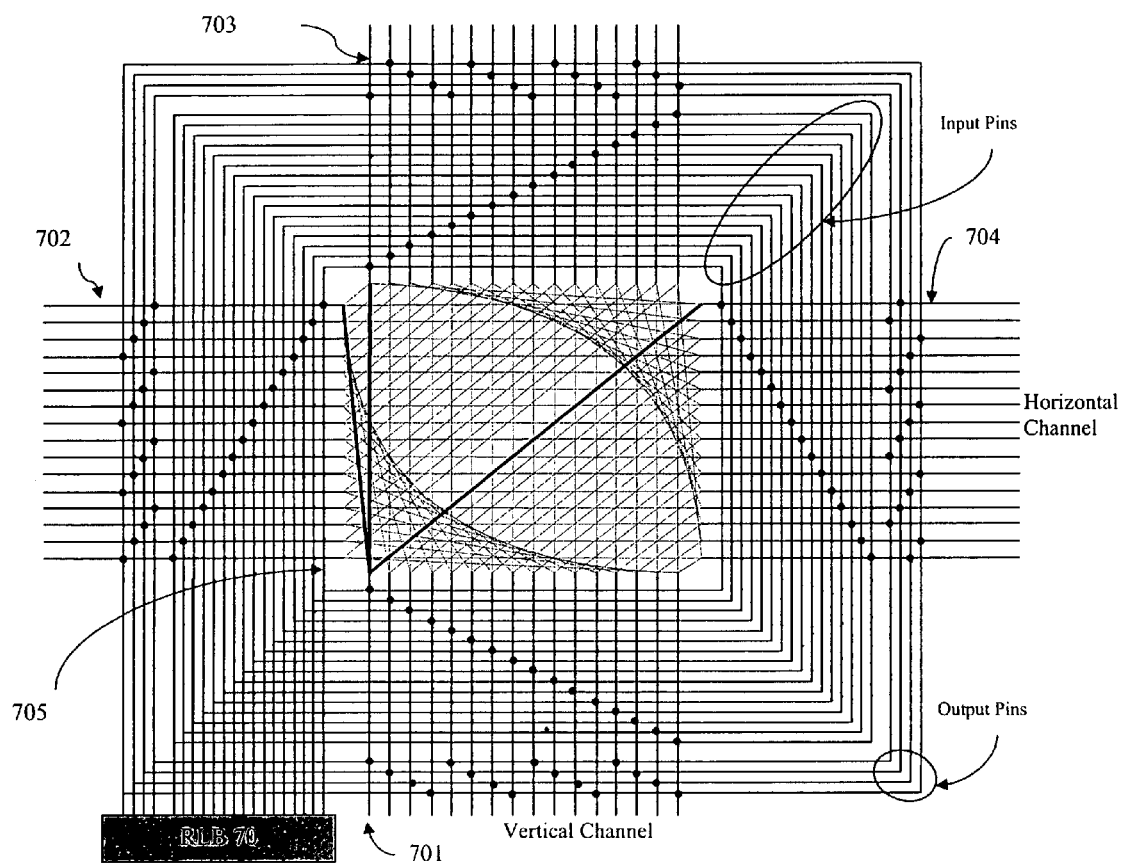
FIG. 7 shows a switch box and four connection boxes of logic block connected to a bi directional single length track routing fabric, wherein the four connection boxes are identical.
Figure 8:
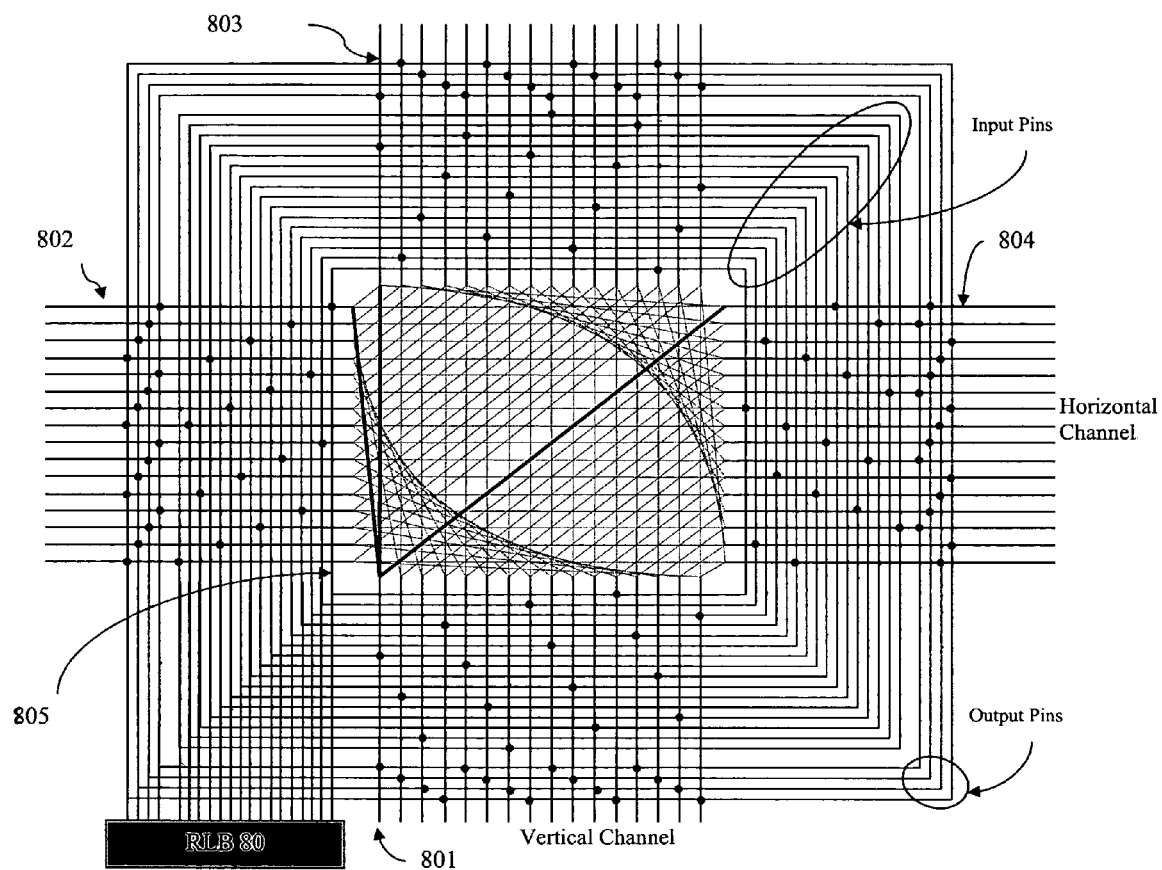
FIG. 8 shows increased connectivity of input pins via indirect routing in case of bidirectional tracks.

FIG. 8 shows an embodiment of the invention using bidirectional routing lines. The routing structure extends in all the directions using a switch box which routes the data in the required direction using any of the tracks. The input is provided by the logic block (or the RLB 80) via the input lines which are connected to the routing lines. For example the input line 805 of the cluster is connected to the routing line 801 directly. However the same input line 805 is connected to other three routing lines 802, 803 and 804 indirectly via the track 801 using the switch box 81. Thus the switch box routes the input to different tracks as per the connections programmed in either direction. Hence the ingenuity is in aligning the connection boxes in such a way that an input is connected to a connecting track of the switch box 80 directly and via the switch box 80 is connected to the non-connecting tracks thereby enabling higher connectivity than a single direct connectivity while maintaining same number of switches.

Figure 9:
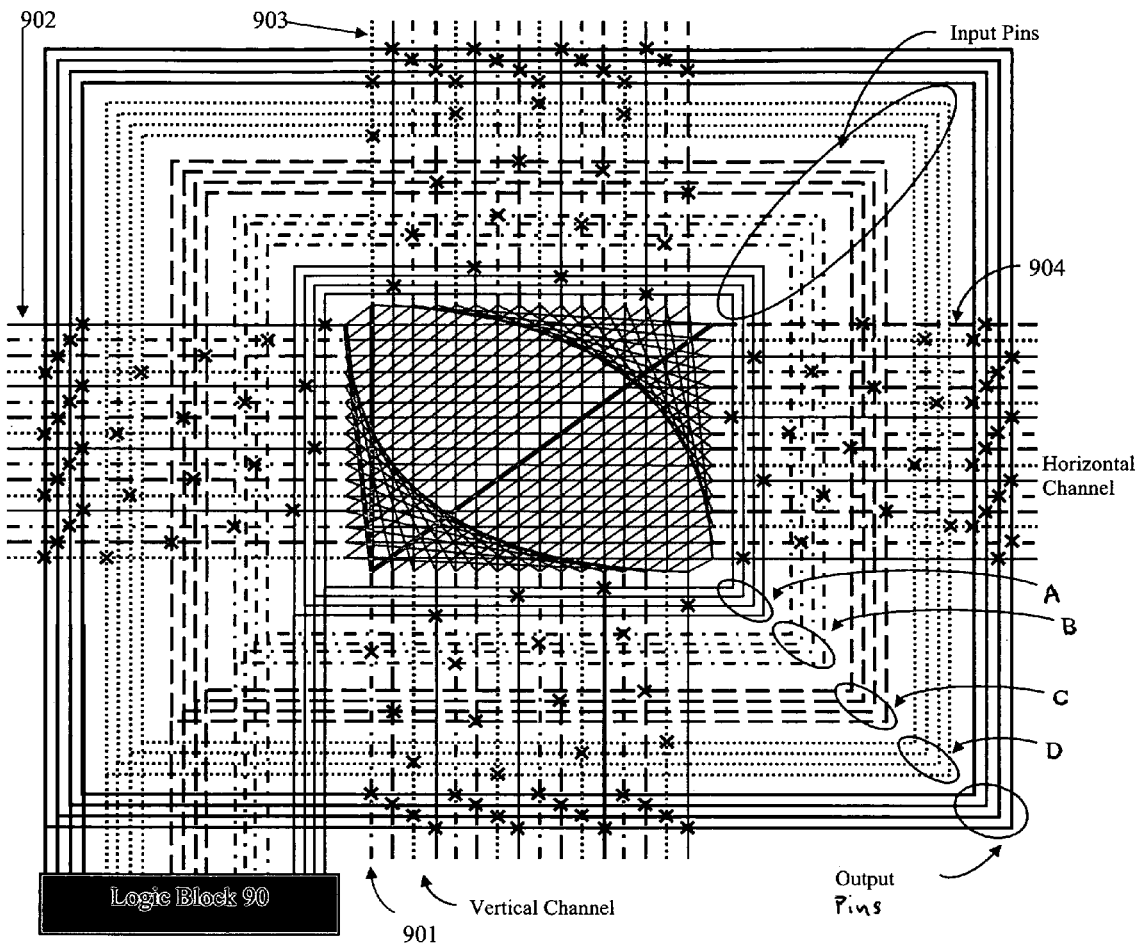
FIG. 9 shows increased connectivity of input pins to different domains via indirect routing in case of bidirectional tracks.

FIG. 9 is another embodiment of the instant invention using bidirectional lines. The four connection boxes of a logic cluster are different. This embodiment extends the aforesaid concept to the domain-based structure as well. As can be seen from the diagram, the input is received from the RLB 90 that is connected directly to the track 901 of domain 2. The switch box 91 routed this line to the tracks of other domains namely track 902 of domain 1 on one side, track 903 of domain 4 on the other side and track 904 of domain 3 on the third side. Thus by one indirection a particular input can be driven to any desired domain.

Figure 10:
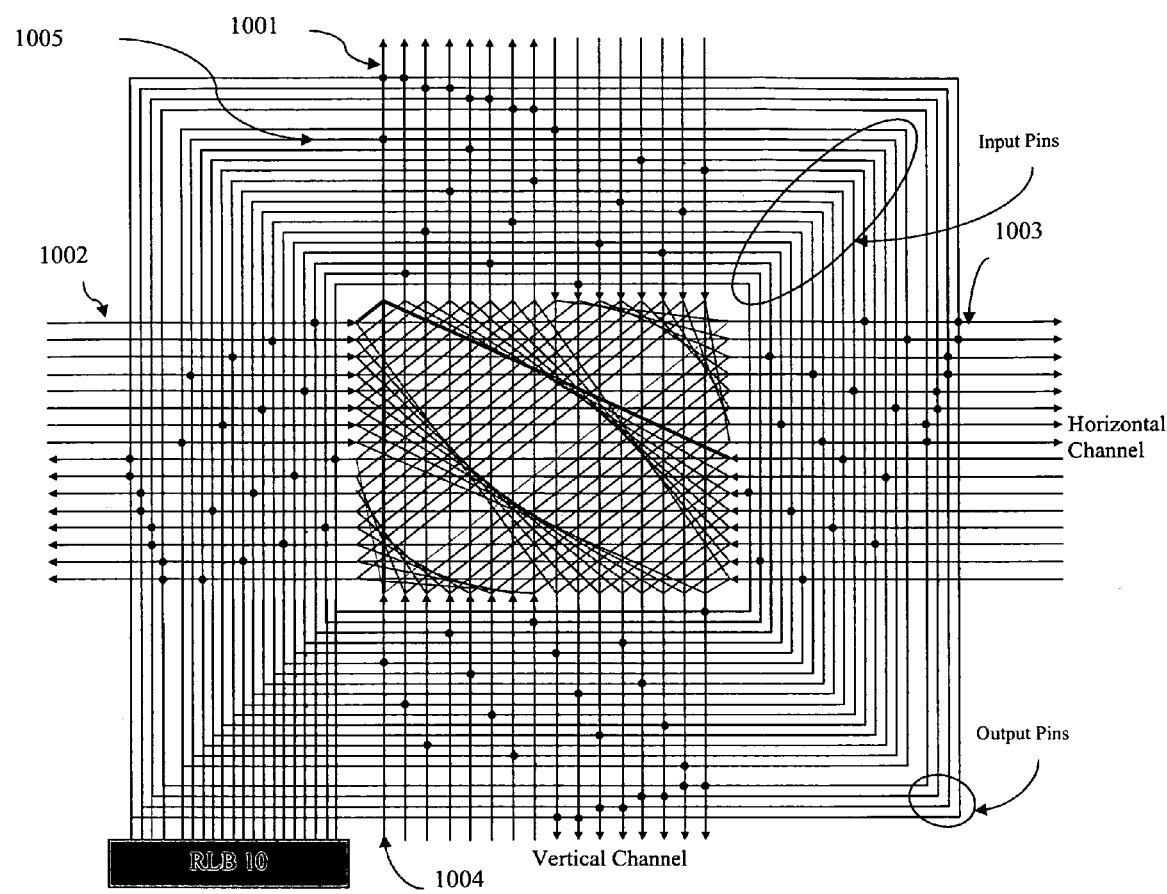
FIG. 10 shows increased connectivity of input pins via indirect routing in case of unidirectional tracks.

This methodology is extended to unidirectional tracks as well where a connection to one out going track gives connectivity to three incoming tracks indirectly as shown in FIG. 10. As shown in the figure, the input pin 1005 is connected to the outgoing track 1001 thereby being connected to three incoming tracks 1002, 1003 and 1004 indirectly. It can be seen that all the lines are logically equivalent and do not form domains. The proposed concept can be extended to domain based unidirectional routing lines as well.

Figure 11:
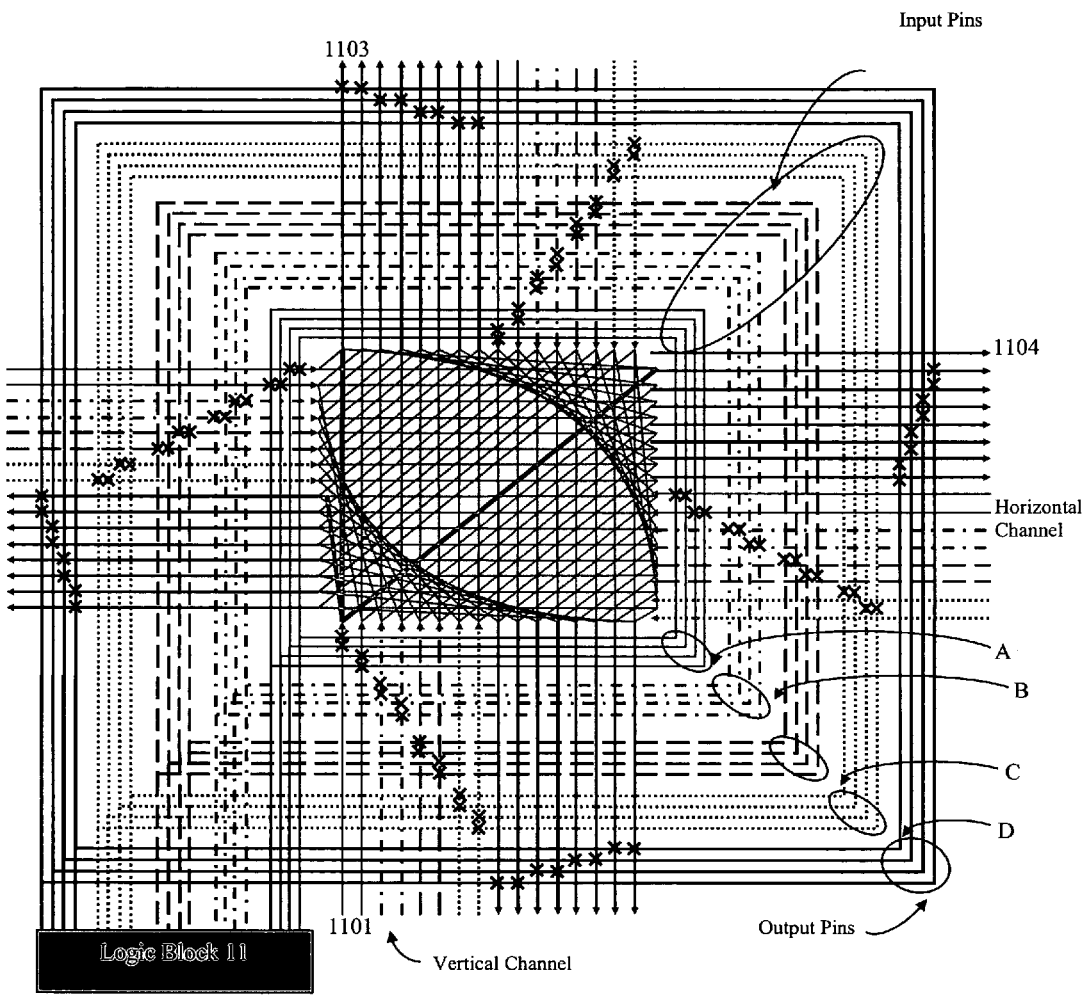
FIG. 11 shows a generic logic tile showing unidirectional single length track routing fabric.
Figure 12:
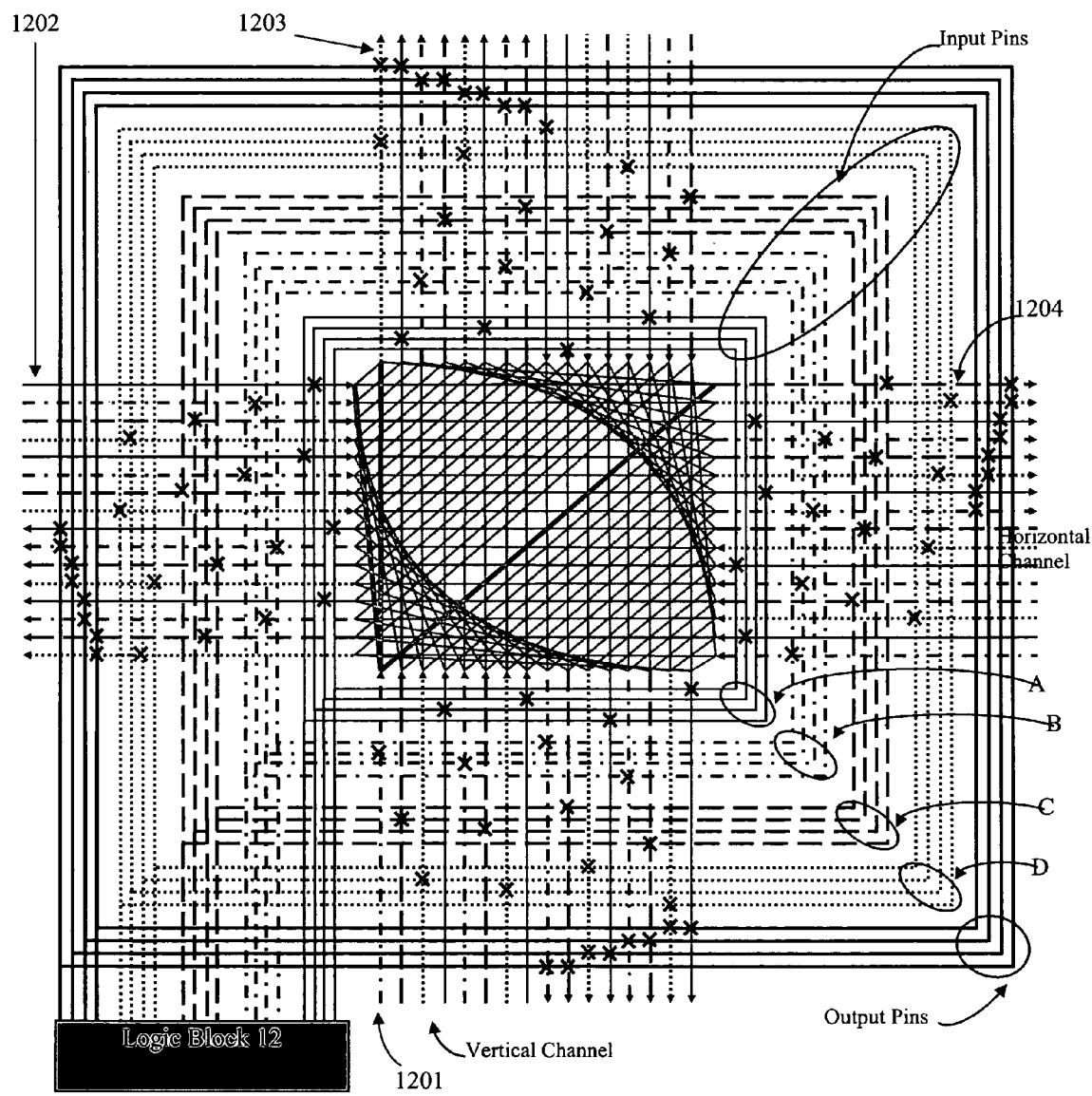
FIG. 12 shows a 'reflection' concept extended to unidirectional tracks.

FIG. 11 shows the connection between switch-box/connection-box in case of unidirectional tracks. In this figure all the incoming tracks are driving one domain only. For example track 1101 of one domain drives track 1102 or 1103 or 1104 of the same domain. There is a need for outgoing tracks to drive the inputs such that different domain reflection is possible. This is depicted in FIG. 12. The track 1201 drives one domain directly, and via 1202, 1203 and 1204 drives the other three domains. The switches have been distributed over incoming and outgoing tracks although the number of switches is the same.

Figure 13:
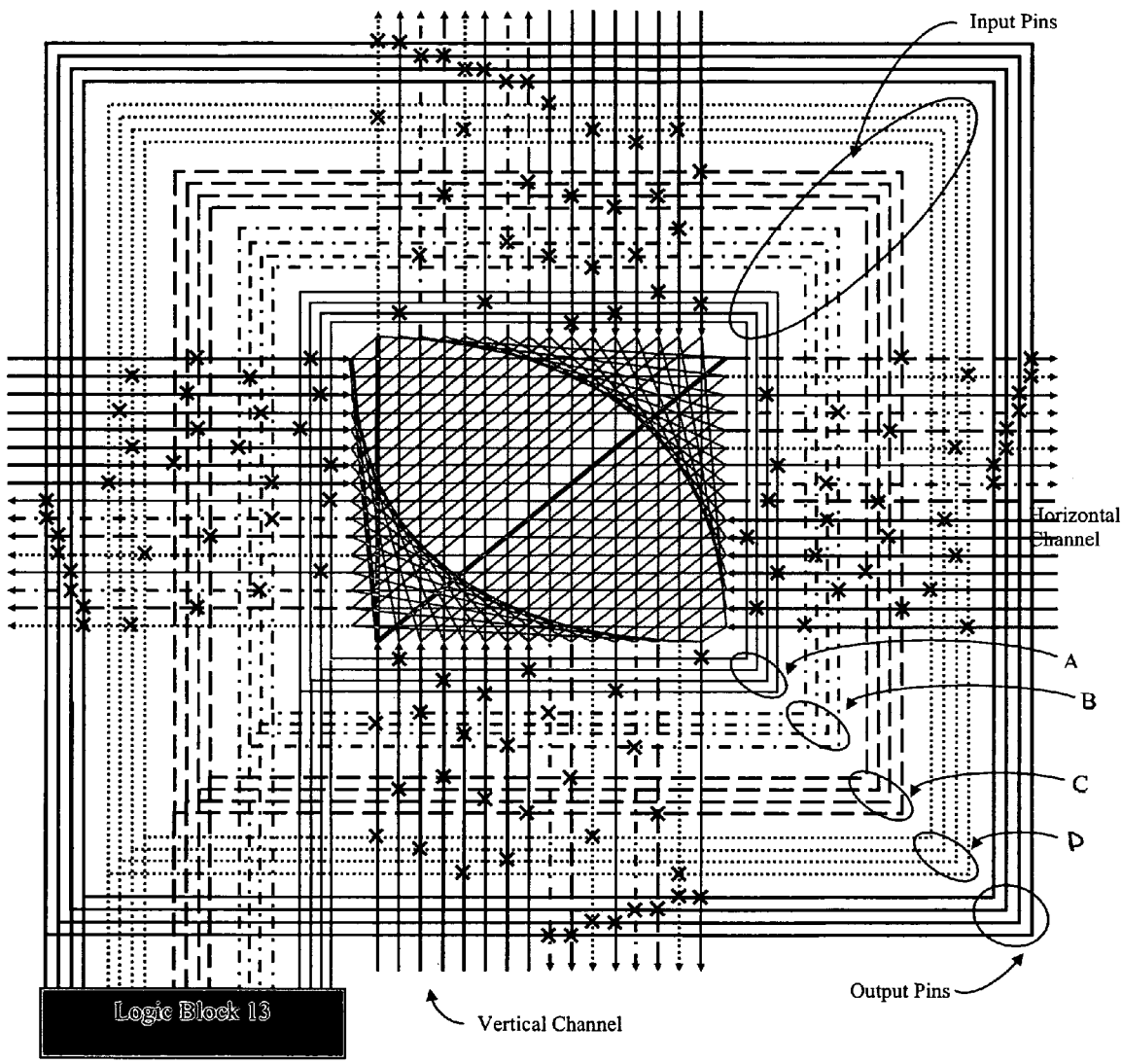
FIG. 13 shows another variation for unidirectional tracks.

FIG. 13 shows connectivity where the switches in the incoming tracks are distributed over incoming and outgoing tracks but extra switches are added in the outgoing tracks. Thus every track drives two domains directly and drives other domains via one reflection.

Further this invention has in general applicability in increasing the connection box routability even if there are no clear-cut demarcations of domains.

This invention is in no way limited to routing fabrics of single length tracks. Anyone skilled in the art can extend the methodology to routing fabrics of different length tracks or heterogeneous routing fabrics in terms of length of tracks. Neither is the invention restricted to either bi-directional or unidirectional. It can be applied to a routing fabric of combination of unidirectional and bi-directional tracks.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An interconnect structure enabling indirect routing in programmable logic comprising:
    a plurality of routing lines; and
    switch box(es) and connection boxes coupled to said plurality of routing lines;
    wherein:
        said connection boxes include at least one programmable switch in each routing track; and
        the position of said programmable switch(es) in each connection box connected to a same interconnect matrix differs from the position of said programmable switch(es) in corresponding routing tracks of other connection boxes thereby utilizing the connectivity of said switch box for input connections and increasing the flexibility of connections.

2. The interconnect structure of claim 1, wherein said interconnect structure is divided into at least one domain, each domain comprising predetermined number of routing lines having at least one said programmable switch thereby connecting a line of one domain to any line of other domains.

3. The interconnect structure of claim 1, wherein said lines include bidirectional and/or unidirectional lines.

4. The interconnect structure of claim 1, wherein said switch box includes disjoint switch boxes.

5. The interconnect structure of claim 1, wherein said switch box includes universal switch boxes.

6. The interconnect structure of claim 1, wherein said switch box includes Wilton switch boxes.

7. The interconnect structure of claim 1, wherein said switch box includes hyper universal switch boxes.

8. The interconnect structure of claim 1 wherein said lines are unidirectional lines and wherein an incoming routing track of the connection boxes on three sides of said interconnect structure is connected to a common outgoing routing track coupled to the input matrix.

9. The interconnect structure of claim 1 wherein said lines are unidirectional lines and wherein the incoming routing tracks of same or different domains linked to the connection boxes on three sides of said interconnect structure are connected to a common outgoing routing track coupled to a domain different from at least one said incoming routing track domains.

10. An interconnect structure enabling indirect routing in programmable logic comprising:
   a plurality of routing lines; and
   switch box(es) and connection boxes coupled to said plurality of routing lines;
   wherein:
      said connection boxes includes a programmable switch in each routing track; and
      the position of said programmable switch in each connection box connected to a same interconnect matrix differs from the position of said programmable switch in corresponding routing tracks of other connection boxes thereby utilizing the connectivity of said switch box for input connections and increasing the flexibility of connections.

11. The interconnect structure of claim 10, wherein said interconnect structure is divided into at least one domain, each domain comprising predetermined number of routing lines having at least one said programmable switch thereby connecting a line of one domain to any line of other domains.

12. The interconnect structure of claim 10, wherein said lines include bidirectional and/or unidirectional lines.

13. The interconnect structure of claim 10, wherein said switch box includes disjoint switch boxes.

14. The interconnect structure of claim 10, wherein said switch box includes universal switch boxes.

15. The interconnect structure of claim 10, wherein said switch box includes Wilton switch boxes.

16. The interconnect structure of claim 10, wherein said switch box includes hyper universal switch boxes.

17. The interconnect structure of claim 10 wherein said lines are unidirectional lines and wherein an incoming routing track of the connection boxes on three sides of said interconnect structure is connected to a common outgoing routing track coupled to the input matrix.

18. The interconnect structure of claim 10 wherein said lines are unidirectional lines and wherein the incoming routing tracks of same or different domains linked to the connection boxes on three sides of said interconnect structure are connected to a common outgoing routing track coupled to a domain different from at least one said incoming routing track domains.

19. An interconnect structure enabling indirect routing in programmable logic comprising:
   a plurality of routing lines; and
   switch box(es) and connection boxes coupled to said plurality of routing lines;
   wherein:
      said connection boxes include a plurality of programmable switches in each routing track; and
      the position of said programmable switches in each connection box connected to a same interconnect matrix differs from the position of said programmable switches in corresponding routing tracks of other connection boxes thereby utilizing the connectivity of said switch box for input connections and increasing the flexibility of connections.

20. The interconnect structure of claim 19, wherein said interconnect structure is divided into at least one domain, each domain comprising predetermined number of routing lines having at least one said programmable switch thereby connecting a line of one domain to any line of other domains.

21. The interconnect structure of claim 19, wherein said lines include bidirectional and/or unidirectional lines.

22. The interconnect structure of claim 19, wherein said switch box includes disjoint switch boxes.

23. The interconnect structure of claim 19, wherein said switch box includes universal switch boxes.

24. The interconnect structure of claim 19, wherein said switch box includes Wilton switch boxes.

25. The interconnect structure of claim 19, wherein said switch box includes hyper universal switch boxes.

26. The interconnect structure of claim 19 wherein said lines are unidirectional lines and wherein an incoming routing track of the connection boxes on three sides of said interconnect structure is connected to a common outgoing routing track coupled to the input matrix.

27. The interconnect structure of claim 19 wherein said lines are unidirectional lines and wherein the incoming routing tracks of same or different domains linked to the connection boxes on three sides of said interconnect structure are connected to a common outgoing routing track coupled to a domain different from at least one said incoming routing track domains.

28. A method for enabling indirect routing in a structure including a plurality of routing lines and switch box(es), comprising the steps of:
   routing input logic to the plurality of routing lines; and
   providing connection means to connect said routing lines as well as said input logic to said routing lines, by:
      providing a plurality of programmable switches in each routing track; and
      positioning said programmable switches in each connection box differently from the position of said programmable switches in corresponding routing tracks of other connection boxes thereby utilizing the connectivity of said switch box for input connections and increasing the flexibility of connections.

* * * * *

UNITED STATES PATENT AND TRADEMARK OFFICE
CERTIFICATE OF CORRECTION

PATENT NO. : 7,307,452 B2  Page 1 of 1
APPLICATION NO. : 11/258616
DATED : December 11, 2007
INVENTOR(S) : Nitin Deshmukh et al.

It is certified that error appears in the above-identified patent and that said Letters Patent is hereby corrected as shown below:

In column 2, line 31, delete "Phd" and insert -- PhD --, therefor.

In column 3, line 19, delete "fanout" and insert -- fan-out --, therefor.

In column 6, line 59, in Claim 8, after "claim 1" insert -- , --.

In column 6, line 64, in Claim 9, after "claim 1" insert -- , --.

In column 7, line 35, in Claim 17, after "claim 10" insert -- , --.

In column 7, line 40, in Claim 18, after "claim 10" insert -- , --.

In column 8, line 26, in Claim 26, after "claim 19" insert -- , --.

In column 8, line 31, in Claim 27, after "claim 19" insert -- , --.

Signed and Sealed this

Thirtieth Day of September, 2008

JON W. DUDAS
*Director of the United States Patent and Trademark Office*